(12) United States Patent
Ohashi et al.

(10) Patent No.: US 11,076,520 B2
(45) Date of Patent: Jul. 27, 2021

(54) PRODUCTION MANAGEMENT DEVICE FOR MOUNTING COMPONENTS ON MULTIPLE BOARD TYPES

(71) Applicant: FUJI CORPORATION, Chiryu (JP)

(72) Inventors: Teruyuki Ohashi, Anjo (JP); Tomokatsu Kubota, Anjo (JP)

(73) Assignee: FUJI CORPORATION, Chiryu (JP)

( * ) Notice: Subject to any disclaimer, the term of this patent is extended or adjusted under 35 U.S.C. 154(b) by 100 days.

(21) Appl. No.: 16/340,179

(22) PCT Filed: Oct. 20, 2016

(86) PCT No.: PCT/JP2016/081130
§ 371 (c)(1),
(2) Date: Apr. 8, 2019

(87) PCT Pub. No.: WO2018/073936
PCT Pub. Date: Apr. 26, 2018

(65) Prior Publication Data
US 2019/0230832 A1    Jul. 25, 2019

(51) Int. Cl.
*H05K 13/08* (2006.01)
*G06Q 10/08* (2012.01)

(52) U.S. Cl.
CPC ....... *H05K 13/085* (2018.08); *G06Q 10/0875* (2013.01); *H05K 13/084* (2018.08)

(58) Field of Classification Search
CPC . H05K 13/085; H05K 13/084; G06Q 10/0875
See application file for complete search history.

(56) References Cited

U.S. PATENT DOCUMENTS

| | | | |
|---|---|---|---|
| 2004/0130863 A1* | 7/2004 | Shimizu | H05K 13/085 361/679.01 |
| 2009/0031559 A1* | 2/2009 | Kawabata | H05K 13/085 29/743 |

(Continued)

FOREIGN PATENT DOCUMENTS

| | | |
|---|---|---|
| JP | 2001-36297 A | 2/2001 |
| JP | 2008-65751 A | 3/2008 |

(Continued)

OTHER PUBLICATIONS

Extended European Search Report dated Oct. 9, 2019, in Patent Application No. 16919341.4, citing document AO therein, 8 pages.

(Continued)

*Primary Examiner* — Thomas C Lee
*Assistant Examiner* — Anzuman Sharmin
(74) *Attorney, Agent, or Firm* — Oblon, McClelland, Maier & Neustadt, L.L.P.

(57) ABSTRACT

A production management device includes data management section having multiple correspondence data in which component types are linked to each product type of board product with reference codes, and process setting section for selecting, when circuit board is carried into component mounting machine in a family production, a product type for each of multiple unit boards based on identification information and sets the type of mounting process to be executed for each of multiple unit boards by selecting correspondence data for the selected product type.

7 Claims, 6 Drawing Sheets

(56) References Cited

U.S. PATENT DOCUMENTS

2009/0062951 A1* 3/2009 Awata .................. G06Q 10/04
                                                                                          700/103
2014/0108293 A1* 4/2014 Barrett .................. G06Q 40/04
                                                                                          705/36 R

FOREIGN PATENT DOCUMENTS

| JP | 2012-227257 A | | 11/2012 |
|----|---------------|---|---------|
| JP | 2012227257 A | * | 11/2012 |
| JP | 2013-4702 A | | 1/2013 |
| JP | 2013004702 A | * | 1/2013 |
| JP | 2014-29962 A | | 2/2014 |
| JP | 2014-154649 A | | 8/2014 |

OTHER PUBLICATIONS

International Search Report dated Jan. 24, 2017 in PCT/JP2016/081130 filed on Oct. 20, 2016.

* cited by examiner

PRODUCTION MANAGEMENT DEVICE FOR MOUNTING COMPONENTS ON MULTIPLE BOARD TYPES

TECHNICAL FIELD

The present application relates to a production management device.

BACKGROUND ART

A production management device manages a production of a board product by a component mounting machine. Occasionally, the component mounting machine performs a family production in which electronic components of different component types are mounted on the same board type to produce multiple types of board products. The component mounting machine includes multiple control programs required for executing mounting processes corresponding to each type of board product, and performs the family production by switching the control programs based on the job data for each product type.

Patent Literature 1 discloses a configuration in which, in order to reduce the memory capacity required for storing a control program, the control program is shared in a family production by using a reference code (i.e., a circuit symbol) for some component types. Patent Literature 2 discloses a configuration in which a multiple pattern board, which is a circuit board composed of multiple unit boards, is a target for a family production in which one of multiple types of mounting processes is performed on each of the multiple unit boards.

PATENT LITERATURE

Patent Literature 1: JP-A-2012-227257
Patent Literature 2: JP-A-2013-004702

BRIEF SUMMARY

Technical Problem

In the family production executed for a multiple pattern board, the proportion of product types in one multiple pattern board is set in advance by job data. During execution of such a family production, when production of a certain product type becomes unnecessary, or when a mounting process becomes unable to be executed, job data may be generated again or a mounting process for a portion of the unit boards may be skipped. However, it takes time to generate job data, and unit boards that are skipped are wasted, thereby increasing production cost.

The present disclosure has been made in view of the above circumstances, and an object of the present disclosure is to provide a production management device capable of handling production requests and preventing increases in production cost by making it possible to switch execution of mounting processes on multiple unit boards.

Solution to Problem

The production management device disclosed in this specification manages the production of a board product by a component mounting machine. The component mounting machine executes a mounting process for mounting an electronic component on a circuit board in the production of the board product, and the circuit board is a multiple pattern board, composed of multiple unit boards, the multiple pattern board to be divided into board products after the mounting process is executed for each of the multiple unit boards. At least some of the multiple unit boards are of the same board type. The component mounting machine includes an identification device for acquiring identification information including the board type for each of the multiple unit boards in the circuit board carried in, and a control device for handling a family production for producing multiple types of board products by executing one of multiple types of mounting processes for each of the multiple unit boards. Each of the multiple types of mounting processes is executed based on a shared control program. The control program links a reference code for referring to the component type of an electronic component to be mounted to mounting coordinates indicating the position at which the electronic component is to be mounted on the circuit board. The production management device includes a data management section having multiple correspondence data in which the component type is linked to each product type of the board product with a reference code and a process setting section for selecting, when the circuit board is carried into the component mounting machine during family production, the product type for each of multiple unit boards based on identification information and sets the type of mounting process to be executed for each multiple unit board by selecting the piece of correspondence data corresponding to the selected product type.

Advantageous Effects

The production management device can switch the product type from an initial production plan for each unit board when production of a product type becomes unnecessary in the midst of a family production, or when a mounting process becomes unexecutable. This makes it unnecessary to skip a mounting process on a unit board, thereby preventing the unit board from being wasted. As a result, it is possible to prevent an increase in production cost and shorten the time required to produce up to a target production number of board products of a required product type. Further, job data for assigning a board type to each of multiple unit boards need not be generated again, thereby improving production efficiency.

DESCRIPTION OF EMBODIMENTS

An embodiment of a production management device will be described below with reference to the drawings. The production management device manages the production of a board product by a component mounting machine. A component mounting machine is a device for picking up an electronic component by a holding member such as a suction nozzle or a chuck device and transferring the electronic component to a predetermined coordinate position on a circuit board. Multiple component mounting machines are arranged side by side in the conveying direction of the circuit board, for example, and constitute a production line for producing a board product.

Embodiment

Configuration of Production Line

Figure 1:
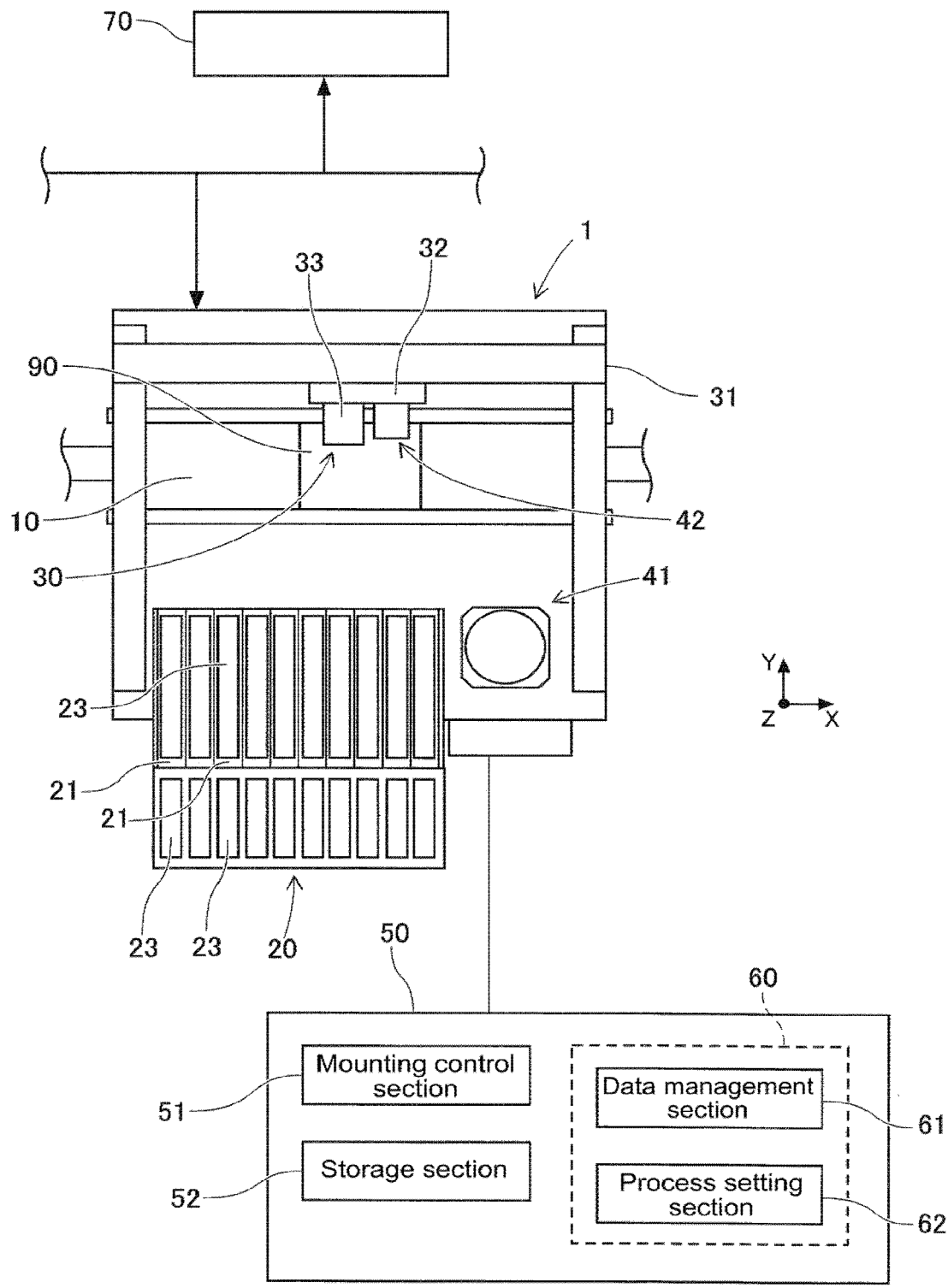
FIG. 1 is a schematic view of a configuration of a component mounting machine according to an embodiment.

The production line is configured by arranging multiple component mounting machines 1 in parallel in the conveying direction of circuit board 90 (i.e., in left-right direction as illustrated in FIG. 1). The production line may include, for example, a screen printer, a mounting inspector, a reflow oven, and the like. Multiple component mounting machines 1 are communicably connected to host computer 70 via a network. Host computer 70 monitors the operating state of the production line and controls the components of the production line including multiple component mounting machines 1. Further, host computer 70 totals the time required by the mounting process of component mounting device 1, the errors that have occurred during execution of the mounting process, and the like.

Configuration of Component Mounting Machine 1

As shown in FIG. 1, component mounting machine 1 includes board conveyance device 10, component supply device 20, component transfer device 30, part camera 41, board camera 42, and control device 50. In the following description, the horizontal width direction (i.e., the left-right direction in FIG. 1) of component mounting machine 1 is taken as the X-axis direction, the horizontal depth direction (i.e., the up-down direction in FIG. 1) of component mounting machine 1 is taken as the Y-axis direction, and the vertical direction (i.e., the front-rear direction in FIG. 1) perpendicular to the X-axis and the Y-axis is taken as the Z-axis direction.

Board conveyance device 10 is configured by a belt conveyor or the like and sequentially conveys circuit board 90 in the conveyance direction, that is, in the X-axis direction in the present embodiment. Board conveyance device 10 positions circuit board 90 at a predetermined position inside component mounting machine 1. After the mounting process by component mounting machine 1 is performed, board conveyance device 10 carries circuit board 90 out of component mounting machine 1.

Component supply device 20 is provided on the front side of component mounting machine 1 (i.e., the down side in FIG. 1). Component supply device 20 supplies electronic components to be mounted on circuit board 90. Component supply device 20 has multiple slots 21 and multiple reel holding sections 22 arranged side by side in the X-axis direction. Feeder 23 is detachably set in each of multiple slots 21. Component supply device 20 feeds and moves carrier tape containing a large number of electronic components with feeder 23, and supplies electronic components so that the electronic components can be collected at a supply position located at the front end of feeder 23. Reel holding section 22 holds the reel on which the carrier tape is wound in an exchangeable manner.

Component transfer device 30 is configured to be movable in the X-axis direction and the Y-axis direction. Component transfer device 30 includes head driving device 31, moving table 32, and mounting head 33. Head driving device 31 is configured to move moving table 32 in the XY-axis direction with a linear motion mechanism. Mounting head 33 is used for collecting electronic components supplied from component supply device 20 and transferring the electronic components to circuit board 90. Mounting head 33 is fixed to moving table 32 by a clamp (not shown).

Mounting head 33 has multiple suction nozzles (not shown) that are detachably provided. Mounting head 33 supports each suction nozzle so that the suction nozzle is rotatable about an R-axis parallel to the Z-axis and able to move up and down. The lifting and lowering position with respect to mounting head 33, angle, and negative pressure supplying state of the suction nozzle is controlled. The suction nozzle picks up electronic components supplied by feeder 23 of component supply device 20 by being supplied with negative pressure.

Part camera 41 and board camera 42 are digital-type imaging devices that have imaging elements, such as a CCD (Charge Coupled Device), CMOS (Complementary Metal Oxide Semiconductor), and the like. Part camera 41 and board camera 42 capture an image of a range that falls within the camera visual field based on a control signal from control device 50 connected in communicable manner and transmit image data acquired by imaging to control device 50.

Part camera 41 is fixed to the base of component mounting machine 1 so that the optical axis faces upward in the vertical direction (Z-axis direction). Part camera 41 is configured to image the electronic component held by the suction nozzle of mounting head 33 from below component transfer device 30. Board camera 42 is provided on moving table 32 of component transfer device 30 so that the optical axis faces downward in the vertical direction (Z-axis direction). Board camera 42 is configured to capture an image of circuit board 90. In the present embodiment, board camera 42 is used to read identification code F (see FIG. 2) attached to the upper surface of circuit board 90.

Configuration of Control Device 50

Control device 50 mainly includes a CPU, various types of memory, and a control circuit. Control device 50 controls the mounting process of electronic components. The mounting process is executed on the basis of the control program (see FIG. 5), which is a process of repeating a pick-and-place cycle (hereinafter, referred to as a PP cycle) multiple times, namely collecting electronic components and transferring the electronic components to circuit board 90. The type of board product to be produced is determined by the type of circuit board 90 and the type of mounting process to be performed.

Further, control device 50 handles a family production in which multiple types of board products are produced by performing one of multiple types of mounting processes on multiple circuit boards having the same board type. Specifically, with the family production, electronic components of different component types are mounted at some of the mounting coordinates indicating positions at which the electronic components are to be mounted on circuit board 90, or mounting of electronic components on some of the mounting coordinates is skipped and the electronic components are not mounted, whereby board products of different product types are produced using the same type of circuit board 90.

As shown in FIG. 1, control device 50 includes mounting control section 51, storage device 52, and production management device 60. Mounting control section 51 controls the position and pickup mechanism operation of mounting head 33. In the mounting process, mounting control section 51 receives information outputted from multiple sensors provided in component mounting machine 1, and results of recognition processes by image processing or the like. Mounting control section 51 then sends a control signal to component transfer device 30 based on the control program, information from various sensors, and results of various recognition processes. In this way, the position and rotation angle of the suction nozzle supported by mounting head 33 are controlled.

When a mounting error occurs in which an electronic component is not mounted normally in an executed mounting process, mounting control section 51 executes a recovery process. The cause of the mounting error is assumed to be, for example, a depletion of a component in component supply device 20, a failure of a supplied electronic component, a failure of a suction nozzle, a solder failure on circuit board 90, or the like. The mounting error is detected on the basis of image processing of image data acquired by imaging by part camera 41 or board camera 42, output values of sensors for monitoring the operational state of the pickup mechanism of mounting head 33, and the like.

The above-described recovery process attempts an automatic recovery on the assumption that the mounting error occurred accidentally, and is a process that does not involve interrupting the mounting process (i.e., stopping component mounting machine 1). However, depending on the cause of the mounting error, a process of replacing reels in feeder 23, restoration work by the operator, or the like may be required. Therefore, for example, mounting control section 51 executes a recovery process when the number of successive mounting errors is less than a threshold value and suspends the mounting process when the number of successive mounting errors is equal to or greater than the threshold value.

Storage device 52 is configured by an optical drive device such as a hard disk drive, flash memory, or the like. Various data for controlling the mounting process of component mounting machine 1 is stored in storage device 52. In addition to job data (see FIG. 5) used for the production of multiple types of product boards, the various types of data include management data (see FIG. 4) indicating the production state of the board products of component mounting machine 1.

In the present embodiment, production management device 60 is incorporated in control device 50 of component mounting machine 1. Production management device 60 manages the production of the board product by setting the type of mounting process to be executed based on management data or the like. The detailed configuration of production management device 60 and details of production management by production management device 60 using management data and the like will be described later.

Configuration of the Circuit Board 90

Figure 2:
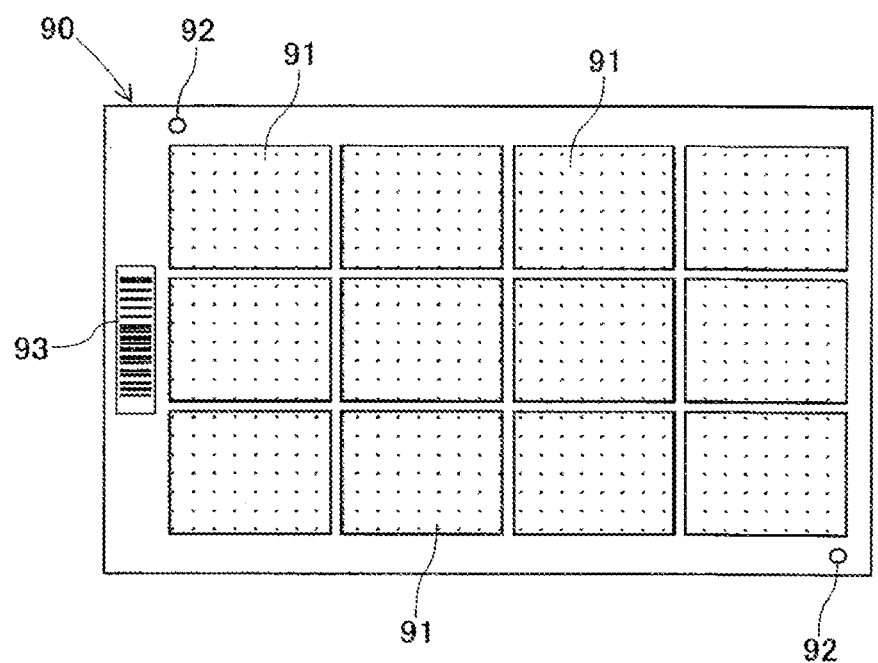
FIG. 2 is a top view showing a circuit board.

Here, as shown in FIG. 2, circuit board 90 in the present embodiment is a multiple pattern board composed of multiple unit boards 91 (i.e., 12 unit boards 91 in the present embodiment). At least some of multiple unit boards 91 in the multiple pattern board are of the same board type. Here, the "board type" of the multiple pattern board indicates the type of each board of multiple unit boards 91.

As described above, multiple unit boards 91 may have the same board type or multiple board types. In multiple unit boards 91, unit boards 91 having the same board type share a common wiring pattern. Such a multiple pattern board is divided into individual board products after the mounting process is performed for each of multiple unit boards 91.

That is, when different types of mounting processes are performed on multiple unit boards 91 having the same board type, multiple types of board products are produced from one circuit board 90. In other words, in a family production with multiple pattern board, each of multiple unit boards 91 is regarded as one circuit board 90, and a predetermined type of mounting process is performed for multiple unit boards 91, whereby multiple board products of multiple product types or the same product type are produced.

Two fiducial marks 92 and identification code 93 are provided on the upper surface of circuit board 90. Each of two fiducial marks 92 indicates a reference position of circuit board 90. Control device 50 recognizes fiducial mark 92 based on image data obtained by capturing fiducial mark 92 with board camera 42. Control device 50 then recognizes the reference position of circuit board 90 positioned by board conveyance device 10 based on the recognized position of fiducial mark 92.

Identification code 93 indicates an identification code (ID) which is unique information of circuit board 90. A bar code, a two-dimensional code, or the like can be used as identification code 93. In the present embodiment, identification code 93 employs a bar code configured by arranging multiple bar lines in parallel having different line widths and spaces between the lines. Control device 50 reads the ID of circuit board 90 based on the image data obtained by capturing identification code 93 with board camera 42.

Control device 50 then acquires identification information including the board type of circuit board 90 based on board type data (not shown) in which the ID of circuit board 90 is linked to the board type in advance. Here, since circuit board 90 is a multiple pattern board, control device 50 acquires the number and positional relationship of multiple unit boards 91 constituting circuit board 90, and the board type of each of multiple unit boards 91, as identification information.

As described above, in the present embodiment, board camera 42 and control device 50 constitute an identification device for acquiring identification information of circuit board 90 carried into component mounting machine 1. Further, control device 50 is configured to acquire, from host computer 70 based on the identification information, processes performed on circuit board 90 on the upstream side of the production line, various set conditions, and the like.

Detailed Configuration of Production Management Device 60

As shown in FIG. 1, production management device 60 includes data management section 61 and process setting section 62. Production management device 60 refers to job data and management data stored in storage device 52 of control device 50. Data management section 61 acquires management data indicating the production state during execution of the family production. Here, as shown in FIG. 4, the management data includes the production state in the form of component remaining number information, error information, product remaining number information, and production history.

Figure 4:
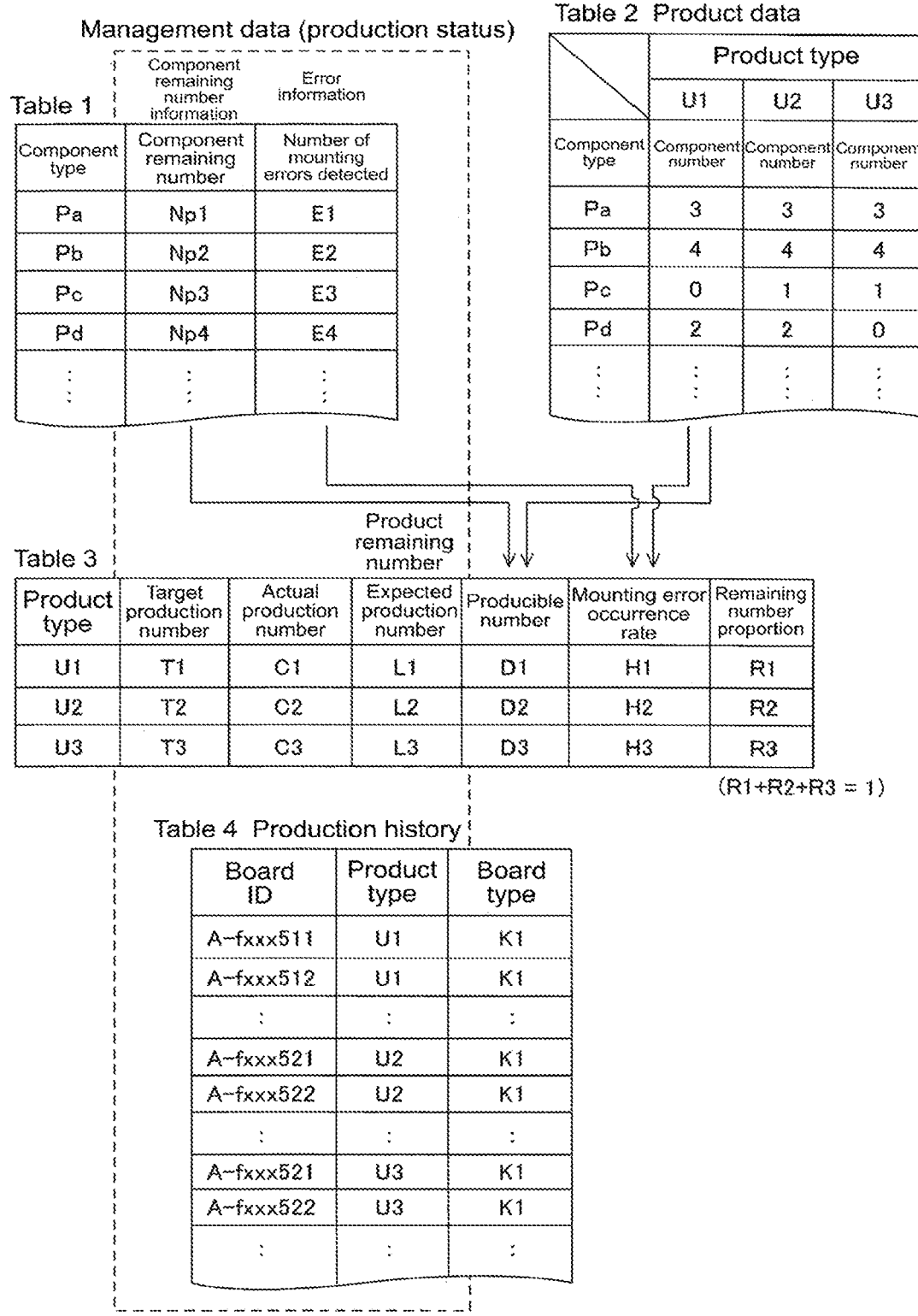
FIG. 4 is a figure showing various data including management data.

As shown in Table 1 of FIG. 4, component remaining number information is information indicating the remaining number (Np1, Np2, Np3, Np4, . . . ) of electronic components that can be supplied in component mounting machine 1 for each component type (Pa, Pb, Pc, Pd, . . . ). Specifically, the remaining number of electronic components corresponds to the number of electronic components accommodated in the carrier tape loaded in feeder 23 which is set in each of multiple slots 21 of component supply device 20. The remaining number of electronic components is managed by control device 50, for example, so as to be subtracted from the initial remaining number every time an electronic component is supplied and returned to the initial remaining number when the reels are replaced.

As shown in Table 1 of FIG. 4, error information is information indicating, for each component type (Pa, Pb, Pc, Pd, . . . ) of the electronic component, the number of times (E1, E2, E3, E4, . . . ) that a mounting error in which the electronic component is not normally mounted is detected in the executed mounting process. Mounting errors are assumed to have various causes such as component depletion, as described above, and it is assumed that one of the causes that has a relatively high degree of difficulty is that of mounting errors due to the shape and dimensions of an electronic component. When a mounting error occurs, control device 50 of component mounting machine 1 later identifies the cause of the mounting error and counts the number of times the mounting error has been detected for each component type in order to reduce the rate of occurrence of the mounting error.

As shown in Table 3 of FIG. 4, product remaining number information is a planned production number (L1, L2, L3), which is the difference (T1−C1, T2−C2, T3−C3) between a target production number (T1, T2, T3) and an actual production number (C1, C2, C3) for each product type (U1, U2, U3). The target production number is set in advance as a production plan for each board type. Further, the actual production number decreases as the family production proceeds. For example, when the mounting process corresponding to first product type U1 is performed four times on multiple unit boards 91 of a multiple pattern board, four board products of first product type U1 are produced from circuit board 90, and therefore, control device 50 adds 4 to actual production number C1 and subtracts 4 from remaining planned production number L1.

As shown in Table 4 of FIG. 4, production history is information in which product types are linked with identification information for each of multiple unit boards 91 of circuit board 90. The production history is information indicating which product type the mounting process has been performed on among multiple unit boards 91 of circuit board 90, and the product type is linked to each of multiple unit boards 91. Data management section 61 records the production state in the form of production history in the management data in accordance with the process of process setting section 62. Details of the production history will be described with respect to the process of production management device 60 in the family production.

Figure 5:
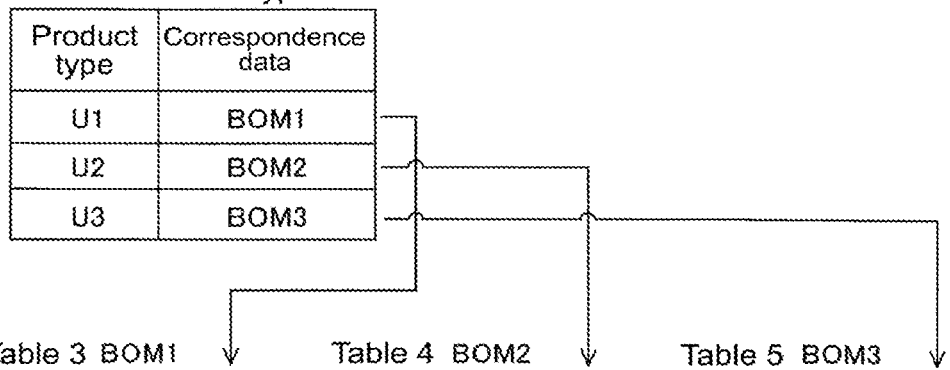
FIG. 5 is a figure showing job data including a control program.

In the present embodiment, data management section 61 has multiple correspondence data (BOM(Bill of Materials)1 in Table 3 of FIG. 5, BOM2 in Table 4, BOM3 in Table 5), product data (see Table 2 of FIG. 4), and proportional data. Here, each of the multiple types of mounting processes executed by mounting control section 51 is executed based on a common control program. In the control program, as shown in Table 1 of FIG. 5, the mounting angle of the electronic component and the reference code are linked to the mounting coordinates of the electronic component.

The mounting coordinates (X-axis coordinates (X1, X2, X3, X4, . . . ) and the Y-axis coordinates (Y1, Y2, Y3, Y4, . . . )) are values indicating positions at which electronic components are mounted on multiple unit boards 91. The mounting angle (θ-axis angle (θ1, θ2, θ3, θ4, . . . )) of the electronic component is a value indicating the angle of the electronic component in the mounting coordinates. The reference code (Ref1, Ref2, Ref3, Ref4, . . . ) is a code for referring to the component type of the electronic component to be mounted at the mounting coordinates.

As shown in Tables 3 to 5 of FIG. 5, the multiple pieces of correspondence data (BOM1, BOM2, BOM3) are data in which component types are linked to reference codes for respective product types (U1, U2, U3). More specifically, in first correspondence data BOM1 used for manufacturing first product type U1, the component types (Pa, Pb, Pc, Pb . . . ) of electronic components are linked to the reference codes (Ref1, Ref2, Ref3, Ref4, . . . ). Further, there are cases where component types referred to by the same reference code are different from the case where the component types are the same (including skipping) among multiple pieces of correspondence data.

As shown in Table 2 of FIG. 5, the multiple product types (U1, U2, U3) and the multiple pieces of correspondence data (BOM1, BOM2, BOM3) are linked in a paired manner as product type-BOM data. With such a configuration, for example, when production of a board product of first product type U1 is executed, first correspondence data BOM1 linked to first product type U1 is used, and electronic components of the component type (Pa) referenced by the first reference code (Ref1) are mounted at the first mounting angle (θ1) at the first mounting coordinate (X1, Y1).

As shown in Table 2 of FIG. 4, the product data is data in which the component types (Pa, Pb, Pc, Pd, . . . ) and the number of electronic components required for producing the board product are recorded for each product type (U1, U2, U3). In other words, the product data indicates, for each component type, the number of components consumed when one board product of a predetermined product type is produced. The proportional data is data indicating the proportional of the target production number (T1, T2, T3) set in advance for each product type (U1, U2, U3). When there is a change in the target production number during execution of the family production, data management section 61 edits the proportional data based on the changed target production number.

When circuit board 90 is carried into component mounting machine 1 in family production, process setting section 62 selects a product type (U1/U2/U3) for each of the multiple unit boards 91 based on the identification information and management data, and sets the type of mounting process to be performed for each of multiple unit boards 91. In the present embodiment, when a product type is selected in family production, process setting section 62 sets the type of mounting process to be executed for each of multiple unit boards 91 by selecting the corresponding data (BOM1/BOM2/BOM3) corresponding to the selected product type (U1/U2/U3).

Consequently, the type of mounting process is set by selecting the correspondence data corresponding to the product type selected for each of multiple unit boards 91. Further, process setting section 62 selects product types for each of multiple unit boards 91 based on various production states in the management data, such as component remaining number information, error information, and product remaining number information. Details of the selection of product types based on each of the various production states are described below.

Production Management by Production Management Device 60

Production management by production management device 60 during execution of the family production will be described with reference to FIGS. 2 to 7. Here, it is assumed that circuit board 90 which is a multiple pattern board is composed of multiple unit boards 91 which are of the same board type. In the family production, a predetermined type of mounting process is performed for each of multiple unit boards 91, and board products of three types of products (U1, U2, U3) are produced at a predetermined rate.

Figure 3:
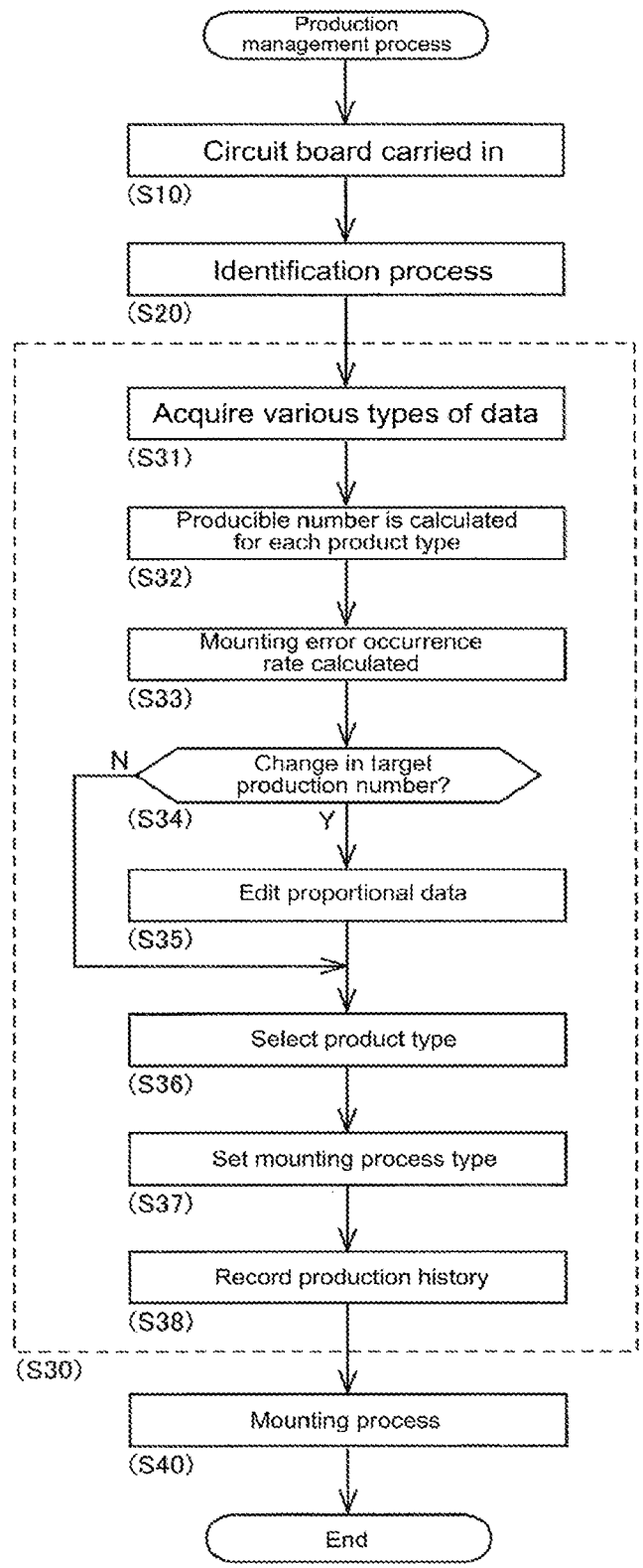
FIG. 3 is a flowchart showing a process of a production management device in a family production.

During execution of the family production, as shown in FIG. 3, circuit board 90 is carried into component mounting machine 1 by board conveyance device 10 (step 10 (hereinafter, "step" will be referred to as "S")). Next, control device 50 of component mounting device 1 executes an identification process for acquiring identification information of circuit board 90 (S20). Specifically, control device 50 functioning as a recognition device captures an image, with board camera 42, of identification code 93 of circuit board 90 positioned by board conveyance device 10 with board camera 42, and reads the ID of circuit board 90 by image processing the image data acquired by the imaging.

Control device 50 then acquires the board type for each of multiple unit boards 91 as identification information based on board type data in which the ID of circuit board 90 is linked to board type in advance. This identification information is stored in storage device 52 as information of circuit board 90, which is a target of the mounting process. Next, production management device 60 executes a setting process for setting the type of mounting process to be executed for each of multiple unit boards 91 (S30). More specifically, first, data management section 61 acquires various types of data such as management data stored in storage device 52 (S31). In addition to the management data, the various types of data include product data, proportional data, and identification information acquired in S20. Next, process setting section 62 calculates producible number (D1, D2, D3) for each product type (U1, U2, U3) based on information regarding the component remaining number in the product data and the management data acquired in S31 (S32).

Subsequently, process setting section 62 calculates the occurrence rate of the mounting error for each of the product types (U1, U2, U3) corresponding to the multiple types of mounting processes based on error information in the product data and the management data acquired in S31 (S33). Thereafter, data management section 61 determines whether there has been a change in the target production number (T1, T2, T3) for each product type (U1, U2, U3) during execution of the family production (S34). When any of the target production numbers is changed (S34: Yes), data management section 61 edits the proportional data based on the changed target production numbers (T1, T2, T3) (S35).

Specifically, in the initial production plan, if the target production numbers for each product type (U1, U2, U3) are T1=1000, T2=1000, and T3=2000, respectively, the proportional data is generated as T1:T2:T3=1:1:2. Subsequently, if target production number T1 of the first product type U1 is changed to "1500", target production number T2 of the second product type U2 is changed to "500", and current actual production numbers for each product type (U1, U2, U3) are C1=500, C2=500, and C3=1000, respectively, the planned production number for each product type are L1=1000, L2=0, and L3=1000, respectively, and the proportional data is edited to T1:T2:T3=1:0:1.

When there is no change in any of initial target production numbers (T1, T2, T3) during execution of family production (S34: No), or when there is a change and the proportional data is edited (S35), the process proceeds to the product type selection process (S36). Here, in order to produce multiple types of board products from multiple unit boards 91 of circuit board 90 in the family production, process setting section 62 selects a product type (U1/U2/U3) for each of multiple unit boards 91 based on the proportional data. For example, when the proportional data is T1:T2:T3=1:1:2, as shown on the left side of FIG. 6, three of twelve unit boards 91 are selected as first product type U1, the other three as second product type U2, and the remaining six as third product type U3.

Figure 6:
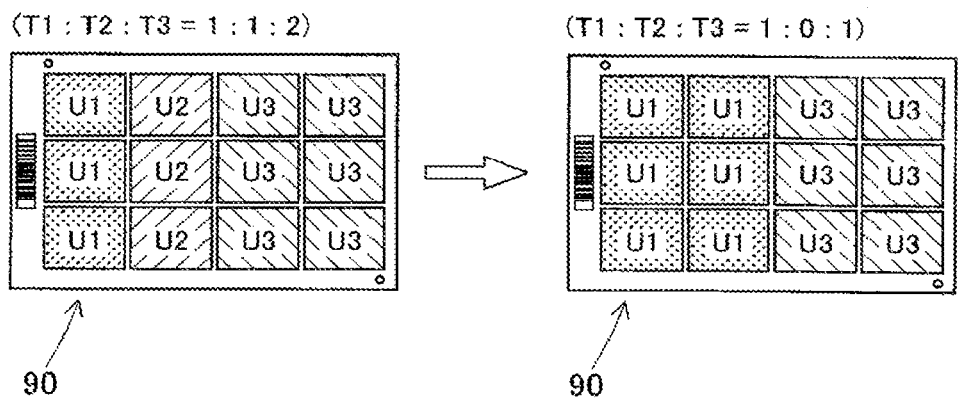
FIG. 6 is a figure showing an exemplary change in product type proportional.

When the edited proportional data is T1:T2:T3=1:0:1, six of twelve unit boards 91 are selected as first product type U1, and the remaining six are selected as third product type U3, as shown on the right side of FIG. 6. When a fraction is generated in the sum total of the number of unit boards 91 in one unit circuit board and the composition proportional of the proportional data, processing setting section 62 adjusts the production of some product types by, for example, allocating the production of the product types by multiple circuit boards 90 which are consecutively carried-in.

Here, in order to execute family production, a production plan is generated in advance, and electronic components necessary for component mounting machine 1 are supplied to component supply device 20. However, during execution of the family production, if, for example, supplying of electronic components by the operator (i.e., replacing of reels) is not done on time, or consumption of predetermined electronic components is larger than planned as a result of executing a recovery process for a mounting error. Therefore, when there is no substitute component, the producible number (D1, D2, D3) for each product type (U1, U2, U3) is reduced, and it may be necessary to stop production by component mounting machine 1 without proceeding with the initial production plan.

Therefore, during family production, process setting section 62 calculates the producible number (D1, D2, D3) for each product type (U1, U2, U3) (S32), and selects the product type for each of multiple unit boards 91 based on the producible number (D1, D2, D3) (S36). Specifically, for example, when producible number D1 of first product type U1 is small or 0, process setting section 62 postpones production of first product type U1 until producible number D1 is restored, and adjusts the proportion of the selected product type based on the proportional data so that production of second product type U2 and third product type U3 is prioritized.

Also, during execution of the family production, a mounting error may occur in which an electronic component is not properly mounted as described above. When such a mounting error occurs accidentally, it is preferable to handle the error with a recovery process. On the other hand, for example, when mounting errors occur highly frequently during a mounting process involving a specific electronic component, it may be possible to shorten the time required for production as a result by temporarily stopping production rather than executing a recovery process and repairing equipment or the like of the equipment causing the mounting errors.

However, when production by component mounting machine 1 is stopped because, for example, a specific type of mounting error has been detected more than a predetermined count number, it may not be possible to immediately handle the situation depending on the state of the operator. In such a case, there is a fear that the downtime for production will become longer. Therefore, during family production, process setting section 62 calculates the incidence rate (H1, H2, H3) of the mounting error for each of the product types (U1, U2, U3) corresponding to the multiple types of mounting processes (S33) and selects the product type (U1/U2/U3) for each of the multiple unit boards 91 so that production of the product type having a low incidence of mounting errors is prioritized in the family production (S36).

Specifically, for example, when occurrence rate H1 of the mounting error in the mounting process corresponding to first product type U1 is higher than threshold value Th (H1>Th), process setting section 62 suppresses or postpones production of first product type U1 until the equipment is repaired by the operator for the mounting error, and adjusts the proportion of the selected product type based on the proportional data so that production of second product type U2 and third product type U3 are prioritized.

Next, process setting section 62 sets the type of mounting process to be performed for each of multiple unit boards 91 in accordance with the product type selected for each of multiple unit boards 91 in S36 (S37). In the present embodiment, process setting section 62 selects correspondence data (BOM1, BOM2, BOM3) corresponding to selected product types (U1, U2, U3) based on product type-BOM data, thereby setting the type of mounting process to be performed on multiple unit boards 91 of circuit board 90.

When the product type is selected for each of multiple unit boards 91 by process setting section 62 in S36, data management section 61 records, as the production state in the management data, the production history in which the product types are linked to identification information for each of multiple unit boards 91 (S38). In the production history of the present embodiment, as shown in FIG. 4, corresponding product types (U1, U2, U3) are linked to identification codes (A to Fxxx511, A to Fxxx512, . . . ) of multiple unit boards 91 of circuit board 90.

This production history is reflected in the component remaining number (Np1, Np2, Np3, Np4, . . . ) for each component type (Pa, Pb, Pc, Pd, . . . ) and the actual production number (C1, C2, C3) for each product type (U1, U2, U3). The production history is used for mounting processes on the downstream side of the production line, inspecting processes of board products, sorting processes after dividing circuit boards 90, and the like.

Mounting control section 51 of control device 50 performs mounting processes for each of multiple unit boards 91 of circuit board 90 (S40). In this mounting process, the type of mounting process to be executed is switched by executing the same control program in multiple types of mounting processes and switching the component types referenced with the reference codes (Ref1, Ref2, Ref3, Ref4, . . . ) included in the control program using the correspondence data (BOM1, BOM2, BOM3). Further, the mounting process (S40) is repeated a number of times corresponding to the number of multiple unit boards 91.

Further, during execution of the family production, the target production number (T1, T2, T3) for each product type (U1, U2, U3) is changed, or production of a predetermined product type is postponed, and in such cases, the proportional of the remaining planned production number (L1, L2, L3) may deviate from the proportional of the initial target production number. In the final stage of the family production, it is then necessary to select product type (U1/U2/U3) for multiple unit boards 91 according to the fractional number of each product type (U1, U2, U3).

Therefore, in S36, process setting section 60 selects a product type for each of multiple unit boards 91 based on the product remaining number information indicating the planned production number (L1, L2, L3) to be decreased by executing the family production. As a result, in the final stage of the family production, it is possible to dynamically set the type of mounting process to be executed based on the production state, that is, information on the remaining number of products included in the management data.

Figure 7:
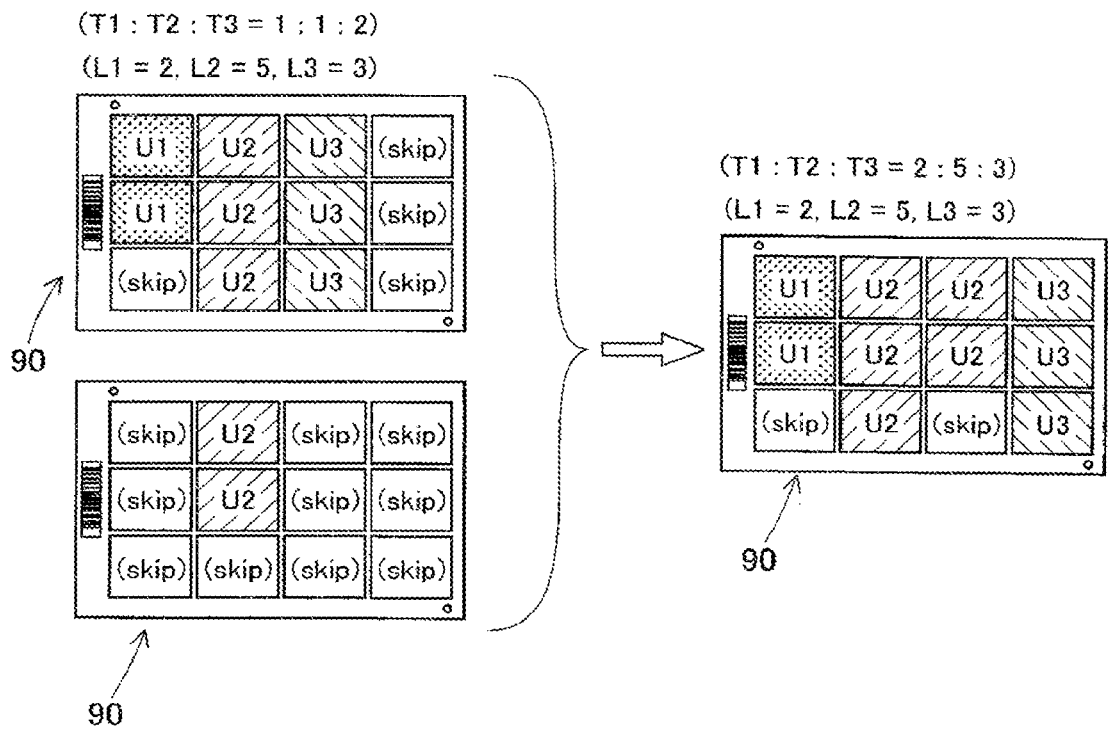
FIG. 7 shows an aggregation of product types in the final stage of a family production.

Specifically, when the proportion of the product types is uniquely determined with respect to the identification information of each of multiple unit boards 91 (for example, T1:T2:T3=1:1:2), as a result of skipping product types for which the actual production number reaches the target production number, as shown in the left side of FIG. 7, multiple circuit boards are required. On the other hand, with the above-mentioned configuration, as shown on the right side of FIG. 7, it is possible to produce the products based on a product type proportion (T1:T2:T3=2:5:3) in which fractions (L1=2, L2=5, L3=3), for each product type (U1, U2, U3) occurring in the final stage of the family production, are aggregated.

Modifications of the Embodiment

Production States in Management Data

In the embodiment, process setting section 62 selects a product type for circuit board 90 based on various types of production state information (i.e., component remaining number, error information, product remaining number information, and the like) in the management data (S36). On the other hand, process setting section 62 may select the product type based on other production states, or may select the product type based on a portion of the described production states (the product remaining number information only, for example). The above-mentioned other production states are assumed to be the operating state of other component mounting machines 1 constituting the production line, the process results of inspection processes of board products, and the like.

Circuit Board

In the embodiment, circuit board 90 is composed of multiple unit boards 91 of the same board type. On the other hand, multiple unit boards 91 may consist of multiple types of boards. In such a configuration, the aspects exemplified in the embodiment can be applied as a family production in which the mounting process is performed on unit boards 91 of the same board type among multiple unit boards 91.

Further, in addition to performing production management on multiple circuit boards carried in series, the embodiment may be applied even in the case where the target production number is collectively produced for each type of product. Specifically, it is assumed that the target production number for each product type (U1, U2, U3) is T1=1000, T2=1000, and T3=2000, respectively, and job data is generated so as to shift to production of second product type U2 after 1000 sheets of first product type U1 are produced.

In such a configuration, production management device 60 acquires management data indicating the production state during execution of the family production, and when it is determined that production of first product type U1 cannot be continued due to, for example, an attachment error, remaining planned production number L1 is postponed and production is shifted to second product type U2. As a result, it is possible to prevent production by component mounting machine 1 from being stopped. Further, when production of first product type U1 becomes possible during production of second product type U2 or third product type U3, it is possible to eliminate downtime of component mounting machine 1 by resuming production of first product type U1 at a predetermined timing.

Other

In the embodiment, production management device 60 is configured to be incorporated in control device 50 of component mounting machine 1. On the other hand, production management device 60 may be an external device of component mounting machine 1. For example, production management device 60 may be incorporated in host computer 70, or may be configured as a dedicated device communicably connected to component mounting device 1 and host computer 70.

As described above, in the configuration in which production management device 60 is an external device of component mounting device 1, when component mounting device 1 carries circuit board 90 into the machine to acquire identification information in the family production, production management device 60 is inquired as to which product type is to be selected. Production management device 60 selects a product type based on the identification information and the management data, and sets the type of mounting process to be performed on circuit board 90 according to the selected product type. Component mounting machine 1 executes a mounting process of the set type.

Effects of Embodiment Configuration

Production management device 60 manages the production of board products using component mounting machine 1. Component mounting machine 1 executes mounting processes for mounting electronic components on circuit board 90 in the production of a board product, and circuit board 90 is a multiple pattern board, composed of multiple unit boards 91 to be divided into individual board products, after the mounting process is executed for each of multiple unit boards 91. At least a portion of multiple unit boards 91 has the same board type. Component mounting device 1 includes an identification device (i.e., board camera 42 and control device 50) for acquiring identification information including the board type for each of multiple unit boards 91 on carried-in circuit board 90, and control device 50 corresponding to family production for producing multiple types of board products by executing one of multiple types of mounting processes for each of multiple unit boards 91. Each of multiple types of mounting processes is executed based on a common control program. The control program links the reference codes (Ref1, Ref2, Ref3, Ref4, . . . ) for referring to the component type of the electronic component to be mounted to mounting coordinates indicating the positions at which the electronic components are mounted on circuit board 90. Production management device 60 includes data management section 61 having multiple correspondence data (BOM1, BOM2, BOM3) in which a component type is linked to each product type (U1, U2, U3) of board product with a reference code, and process setting section 62 that selects the product type for each of multiple unit boards 91 based on identification information (S36) when circuit board 90 is carried into component mounting machine 1 in the family production, and sets the type of mounting process to be executed for each of multiple unit boards 91 by selecting correspondence data corresponding to the selected product type.

With such a configuration, process setting section 62 sets the type of mounting process by selecting correspondence data (S37). That is, the control program used for the family production is shared, and the storage capacity required for component mounting device 1 can be reduced. Further, since referenced correspondence data (BOM1, BOM2, BOM3) is switched in response to a change in the production state, it is possible to reliably handle a change in the target production numbers (T1, T2, T3) for each product type.

In addition, when production becomes unnecessary during execution of the family production or a mounting process for a product type becomes unexecutable, the product type can be switched from the initial production plan for each unit board 91. This makes it unnecessary to skip the mounting process for unit board 91, and it is possible to prevent unit board 91 from being wasted. As a result, it is possible to prevent an increase in production cost, and shorten the time required to produce board products of a required product type in accordance with the target production numbers (T1, T2, T3). Further, job data for assigning a board type to each of multiple unit boards 91 does not need to be generated again, thereby improving production efficiency.

Data management section 61 acquires management data indicating the production state during execution of the family production. Process setting section 62 selects a product type for each of multiple unit boards 91 based on the identification information and the management data (S36), and sets the type of mounting process to be executed for each of multiple unit boards 91 (S37).

With such a configuration, production management device 60 selects the product type in accordance with identification information for each of multiple unit boards 91 in circuit board 90 carried into the machine and the production state of circuit board 90 at the time of carrying in (S36). In this manner, production management device 60 can handle variations in production states by setting multiple types of mounting processes by automatic switching. Therefore, as compared with the configuration in which the product type is determined in advance for the identification information, it becomes unnecessary to generate job data again, thereby improving production efficiency.

Further, data management section 61 has product data in which the component type and the number of components required for producing the board product are recorded for each product type. The management data includes, as a production state, component remaining number information indicating, for each component type, the number of remaining electronic components that can be supplied by component mounting device 1. Process setting section 62 calculates the number of products that can be produced for each product type based on component remaining number information from the product data and the management data (S32) and selects the product type for circuit board 90 based on the number of products that can be produced (S36).

As a result, for example, production of product types having a small or zero producible number is postponed, and production of product types having a large producible number is prioritized. In this manner, the product type can be switched according to the production state that includes the component remaining number information. Further, since the stopping of production can be prevented, the time required for the family production as a whole can be shortened.

Further, data management section 61 has product data in which the component type and the number of electronic components required for production of the board product are recorded for each product type. The management data includes production state, that is, error information indicating, for each component type, the number of mounting errors, in which the electronic component is not mounted normally, detected in the executed mounting process. Process setting section 62 calculates the occurrence rate of mounting errors for each product type corresponding to multiple types of mounting processes based on error information in the product data and the management data (S33) and selects the product type for circuit board 90 so that production of the product type in which the occurrence rate (H1, H2, H3) of the mounting error is low is prioritized in the family production (S36).

As a result, for example, production of a product type having a high occurrence rate of mounting errors is suppressed or postponed and production of a product type having a low occurrence rate of mounting errors is prioritized. Consequently, the product type can be switched according to the production state which includes error information. Therefore, the number of execution the recovery process is executed can be reduced and stopping of the production can be prevented, thereby shortening the time required for the family production as a whole.

Data management section 61 includes proportional data indicating the proportional of the target production numbers (T1, T2, T3) set in advance for each product type. When multiple types of board products are produced from multiple unit boards 91 in the family production, process setting section 62 selects the product type for each of multiple unit boards 91 based on the proportional data (S36). When the target production number (T1, T2, T3) is changed during execution of the family production (S34: Yes), data management section 61 changes the proportional data based on the changed target production number (S35). Process setting section 62 selects the product type for each of multiple unit boards 91 based on the proportional data edited in the family production (S36).

As a result, when the target production number (T1, T2, T3) is increased or changed due to a request to increase production of a portion of the product types, the production is prioritized so that the number of product types is increased with respect to multiple unit boards 91. This makes it unnecessary to generate the job data again, making it unnecessary to skip a portion of the mounting process.

Further, the management data includes the production state, that is, product remaining number information indicating the planned production number (L1, L2, L3) which is the difference between the target production number (T1, T2, T3) and the actual production number (C1, C2, C3) in the family production for each product type. Process setting section 62 selects the product type for each of multiple unit boards 91 based on the product remaining number information indicating the planned production number (L1, L2, L3) to be decreased by executing the family production (S36).

As described above, the target production number (T1, T2, T3) may be changed during execution of the family production, or the production of a predetermined product type may be postponed, so that the proportion of the remaining planned production number (L1, L2, L3) may deviate from the proportion of the initial target production number. Then, in the final stage of the family production, it is necessary to select the product type for each of multiple unit boards 91 in accordance with the fractional number for each product type. Therefore, process setting section 62 selects the product type for each of multiple unit boards 91 based on the planned production number (L1, L2, L3) which decreases due to executing the family production (S36). This makes it possible to appropriately set the type of mounting process to be executed based on the production state which includes product remaining number information.

When a product type is selected for each of multiple unit boards 91 by process setting section 62, data management section 61 records the production state in the management data, that is, the production history in which each product type is linked to identification information for each of multiple unit boards 91 (S38).

With such a configuration, the product type is selected based on the production state by process setting section 62, and it is possible to handle production of board products in an order different from the production plan generated in advance. For example, on the downstream side of the production line of which component mounting device 1 constitutes a part, it is possible to execute a subsequent mounting process according to the selected product type, the inspection process of the board product, and the sorting process for each product type based on the product types of multiple unit boards 91 in circuit board 90 linked to the identification information.

Production management device 60 is incorporated in control device 50 of component mounting machine 1. With such a configuration, component mounting device 1 can individually select a board type on the basis of identification information for each of multiple unit boards 91 in the circuit board 90 carried into the machine, for example, without inquiring the host computer, and can dynamically set the type of mounting process to be executed for each of multiple unit boards 91 in circuit board 90. This makes it possible to immediately evaluate the switching of the product type and shorten the time required for the family production as a whole.

REFERENCE SIGNS LIST

1: Component mounting device, 10: Board conveyance device, 20: Component supply device, 21: Slot, 22: Reel holding section, 23: Feeder, 30: Component transfer device, 31: Head driving device, 32: Moving table, 33: Mounting head, 41: Part camera, 42: Board camera (identification device) 50: Control device (identification device), 51: Mounting control section, 52: Storage device, 60: Production management device, 61: Data management section, 62: Process setting section, 70: Management device, 90: Circuit board, 91: Unit board, 92: Fiducial mark, 93: Identification code

The invention claimed is:

1. A production management device configured to manage production of a board product using a component mounting machine, the component mounting machine performing a mounting process for mounting an electronic component to a circuit board in a production of the board product, the circuit board being a multiple pattern board composed of multiple unit boards to be divided into individual board products after the mounting process is performed for each of the multiple unit boards, and at least a portion of the multiple unit boards having the same board type, the component mounting machine including an identification device configured to acquire identification information including the board type for each of the multiple unit boards of the circuit board; and a control device configured to handle a family production for producing multiple types of board products by performing one of multiple types of mounting processes for each of the multiple unit boards, each of the multiple mounting processes being executed based on a common control program, the control program linking a reference code for referring to the component type of the electronic component to be mounted onto mounting coordinates indicating the position at which the electronic component is to be mounted on the circuit board, the production management device including a processor, comprising:

a data management section including multiple pieces of correspondence data in which component types are linked to each product type of the board product with the reference code, and proportional data indicating a proportion of target production numbers set in advance for each product type, the data management section configured to acquire management data indicating a production state during execution of the family production, the production state including component remaining number information indicating the number of remaining electronic components to be supplied in the component mounting machine for each component type, and edit the proportional data during execution of the family production when the target production numbers are changed during execution of the family production, and a process setting section configured to select a product type for each of the multiple unit boards based on the identification information, when the circuit board is carried into the component mounting machine in the family production, set the type of mounting process to be executed for each of the multiple unit boards by selecting the correspondence data corresponding to the selected product type, calculate the number of products that can be produced for each product type based on the component remaining number information, and select the product type for the circuit board based on the number of products that can be produced and on the proportional data when producing multiple types of board products from multiple unit boards in the family production.

2. The production management device according to claim 1, wherein the process setting section is configured to select the product type for each of the multiple unit boards based on the identification information and the management data, and set the type of mounting process to be executed for each of the multiple unit boards.

3. The production management device according to claim 2, wherein the data management section includes product data in which the component type and the number of components required for production of the board product are recorded for each product type.

4. The production management device according to claim 2, wherein the data management section includes product data in which a component type and a component number of the electronic component required for the production of the board product are recorded for each product type;

the management data includes error information indicating the number of times that a mounting error in which the electronic component was not mounted normally was detected in the executed mounting process for each component type as the production state; and the process setting section is configured to calculate an occurrence rate of the mounting error for each of the product types corresponding to multiple types of mounting processes based on the error information in the product data and the management data, and select the product type for the circuit board so that the production of the product type having a low occurrence rate of the mounting error is prioritized in the family production.

5. The production management device according to claim 1, wherein the management data includes, as the production state, product remaining number information indicating the planned production number, which is the difference between the target production number and the actual production number in the family production, for each product type, and the process setting section is configured to select the product type for each of the multiple unit boards based on remaining production number information indicating the planned production number decreased by executing the family production.

6. The production management device according to claim 2, wherein the data management section is configured to record, when the product type is selected for each of the multiple unit boards by the process setting section, the production state in the management data, that is, the production history in which each of the multiple product types is linked to the identification information for each of the multiple unit boards.

7. The production management device according to claim 1, wherein the production management device is configured to be incorporated in the control device of the component mounting machine.

* * * * *